（12）United States Patent
Kuo et al.

(10) Patent No.: US 8,116,139 B2
(45) Date of Patent: Feb. 14, 2012

(54) BIT LINE STABILITY DETECTION

(75) Inventors: Tien-chien Kuo, Sunnyvale, CA (US);
Man L. Mui, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 265 days.

(21) Appl. No.: 12/697,003

(22) Filed: Jan. 29, 2010

(65) Prior Publication Data

US 2011/0188314 A1 Aug. 4, 2011

(51) Int. Cl.
*G11C 11/34* (2006.01)
(52) U.S. Cl. .............................. 365/185.18; 365/189.07
(58) Field of Classification Search ............. 365/185.18, 365/189.07, 206
See application file for complete search history.

(56) References Cited

U.S. PATENT DOCUMENTS

| | | | |
|---|---|---|---|
| 5,132,931 A | 7/1992 | Koker | |
| 5,557,193 A | 9/1996 | Kajimoto | |
| 5,966,319 A | 10/1999 | Sato | |
| 6,906,937 B1 | 6/2005 | Nataraj | |
| 6,987,693 B2 | 1/2006 | Cernea et al. | |
| 7,142,468 B2 | 11/2006 | Kato et al. | |
| 7,236,415 B2 * | 6/2007 | Forbes et al. | 365/207 |
| 7,289,354 B2 | 10/2007 | Houston | |
| 7,525,854 B2 | 4/2009 | Huang | |
| 7,545,675 B2 | 6/2009 | Kamei | |
| 7,898,885 B2 * | 3/2011 | Sarin et al. | 365/207 |
| 2003/0128598 A1 | 7/2003 | Lim et al. | |
| 2003/0173998 A1 * | 9/2003 | Terzioglu et al. | 327/51 |
| 2003/0174545 A1 | 9/2003 | Wada et al. | |
| 2008/0205180 A1 | 8/2008 | Lee | |
| 2009/0109766 A1 | 4/2009 | Terzioglu et al. | |
| 2009/0147605 A1 | 6/2009 | Rengarajan et al. | |
| 2009/0231934 A1 | 9/2009 | Jung et al. | |

* cited by examiner

*Primary Examiner* — Vu Le
(74) *Attorney, Agent, or Firm* — Vierra Magen Marcus & DeNiro LLP

(57) ABSTRACT

A power supply and monitoring apparatus such as in a non-volatile memory system. A power supply circuit provides power to a large number of sense modules, each of which is associated with a bit line and a string of non-volatile storage elements. During a sensing operation, such as a read or verify operation, a discharge period is set in which a sense node of each sense module discharges into the associated bit line and string of non-volatile storage elements, when the string of non-volatile storage elements, is conductive. This discharge sinks current from the power supply, causing a perturbation. By sampling the power supply, a steady state condition can be detected from a rate of change. The steady state condition signals that the discharge period can be concluded and data can be latched from the sense node. The discharge period automatically adapts to different memory devices and environmental conditions.

20 Claims, 9 Drawing Sheets

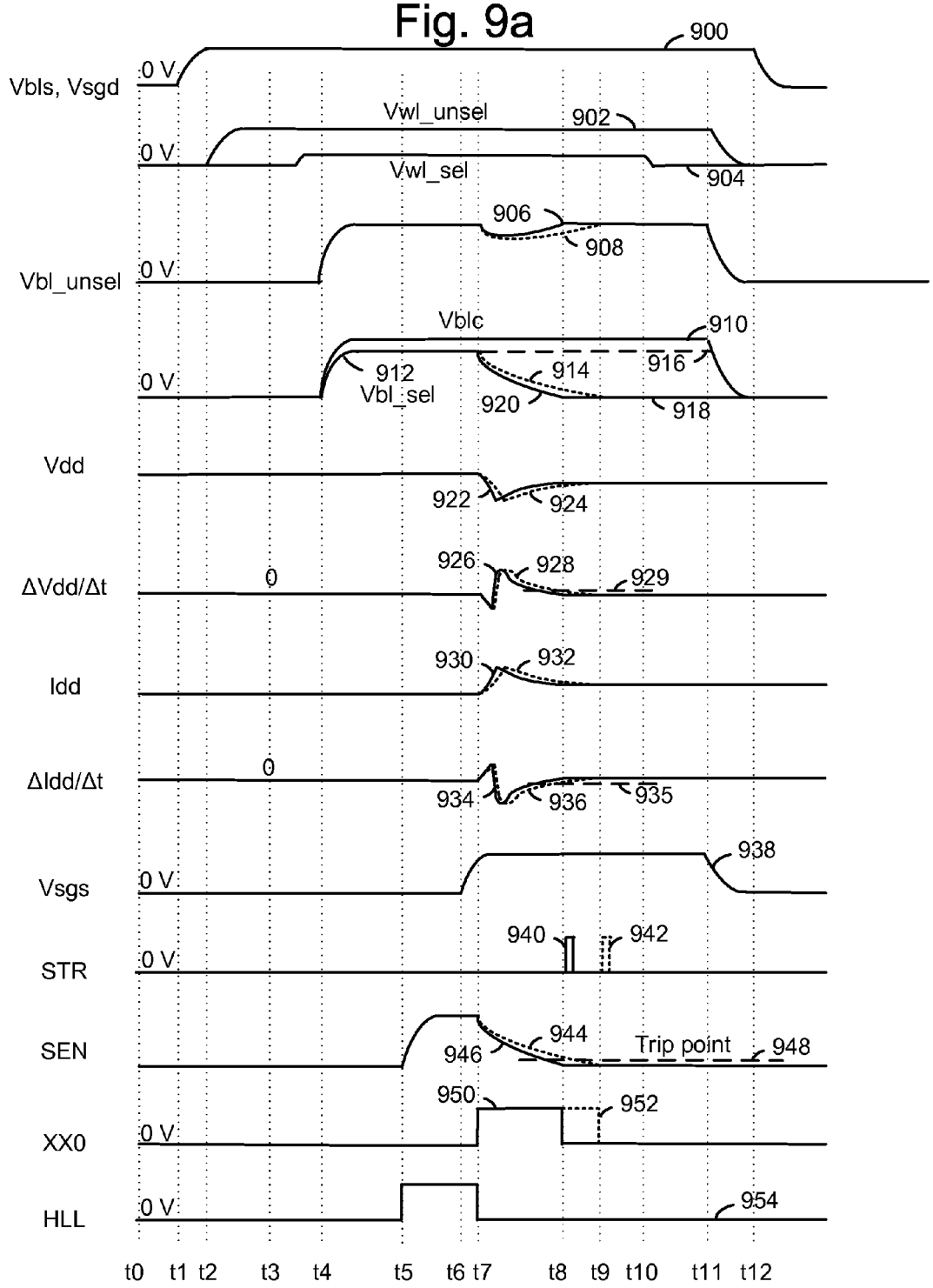

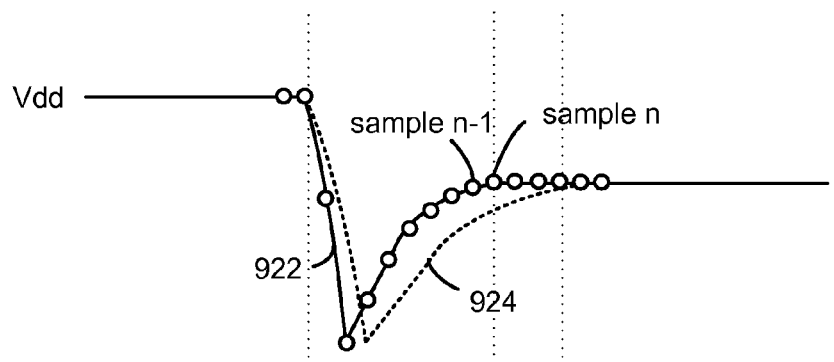
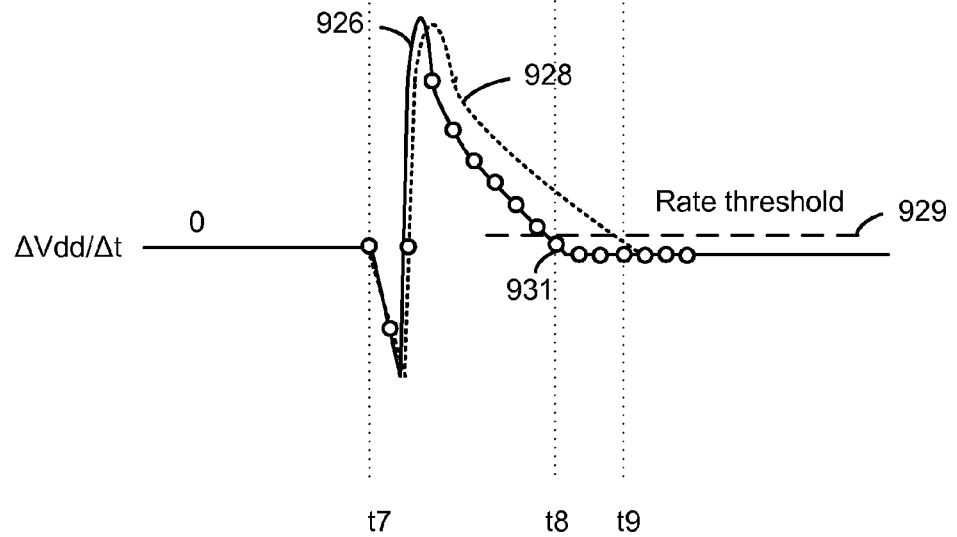

BIT LINE STABILITY DETECTION

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

A sensing operation, such as a read or verify operation, typically involves applying a control gate voltage to a storage element, charging a bit line which is associated with the storage element via a sense module, and allowing the bit line to discharge through the storage element if the storage element is rendered in a conductive state by the control gate voltage. The sense module latches a result of the sensing at a specified time. However, providing an optimum time budget for the sensing operation is problematic.

BRIEF DESCRIPTION OF THE DRAWINGS

FIG. 8c depicts details of step 806 of FIG. 8a.

FIG. 9a depicts time lines associated with step 806 of FIG. 8a.

FIG. 9b depicts an expanded view of waveforms 922 and 924 of FIG. 9a.

FIG. 9c depicts an expanded view of waveforms 926 and 928 of FIG. 9a.

DETAILED DESCRIPTION

A method and non-volatile storage system are provided for optimizing a sensing operation such as a read or verify operation.

As mention at the outset, providing an optimum time budget for a sensing operation is problematic. The time for charging or discharging a bit line is set based on factors such as bit line-to-bit line capacitance, bit line resistance, data pattern, the strength of a power supply or pull-up device which is used to charge up the bit line and recover the bit line after it discharges, and the power supply level and stability. However these factors can vary in different memory devices, e.g., due to processing variations and process corners, as well as in a single memory device, e.g., due to time-varying environmental conditions such as temperature. In fact, many variations are unpredictable.

A fixed optimal bit line time budget which is suitable for all cases for typical production purposes has to consider the worst case so that the memory device will not fail once it reaches the end user. But, in reality, the worst case does not happen very often, so that the time budget is too high and performance is reduced, e.g., a sense operation consumes more time than is necessary. For example, the worst case time budget may be about 15-20% longer than is necessary for an average memory device.

An adaptive sensing solution provided herein sets an adaptive time budget which is always optimal. In particular, a time for latching data in a sense module, at the end of a sense node discharge period, is set adaptively by monitoring a power supply of the sense module. This discharge sinks current from the power supply, causing a perturbation, particularly when multiplied by the many sense modules which are connected to a common power supply. By sampling the power supply, a steady state condition can be detected from a rate of change. The steady state condition signals that the discharge period can be concluded and data can be latched. The discharge period automatically adapts to different memory devices and environmental conditions.

Figure 1:
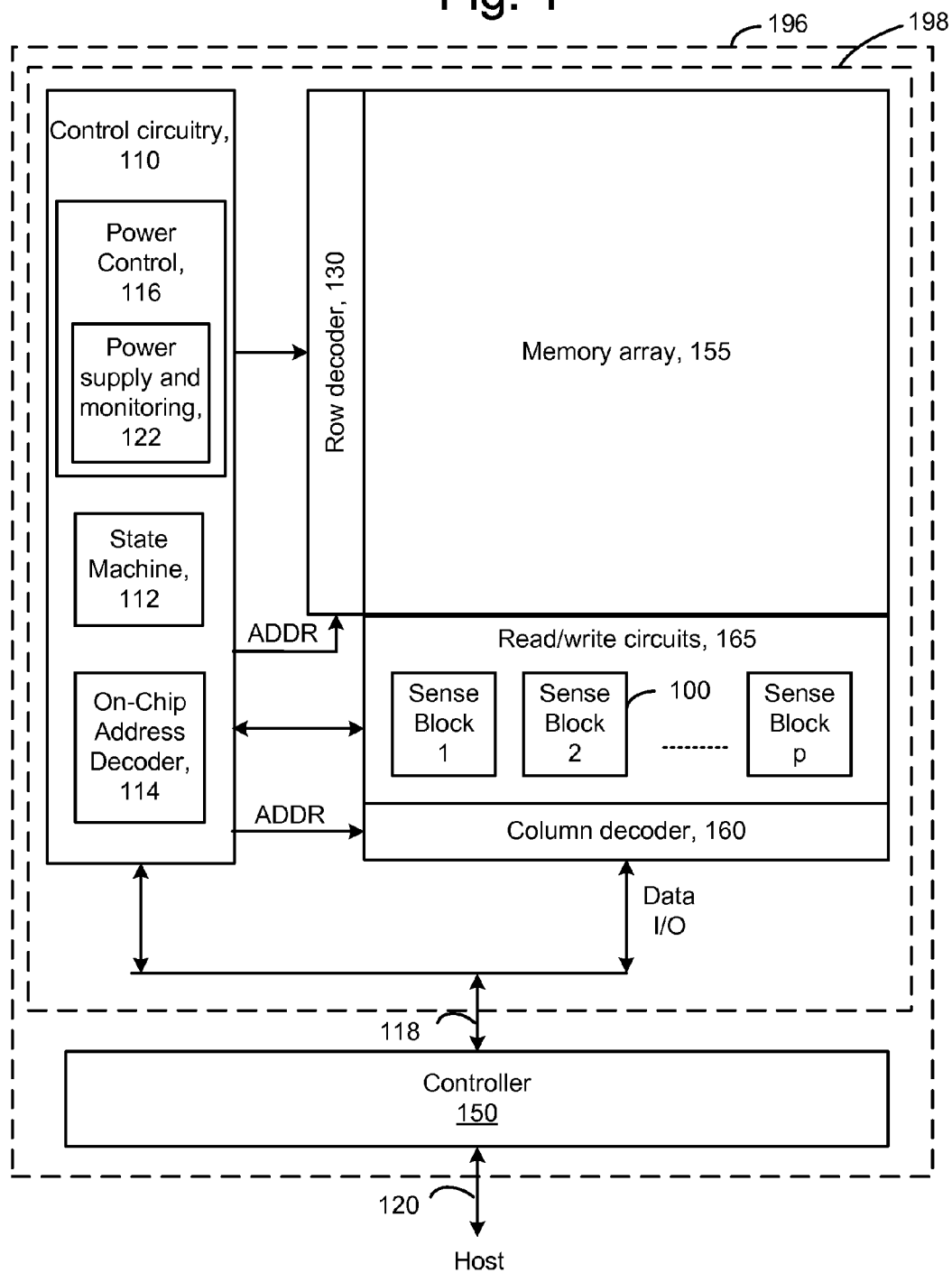
FIG. 1 is a block diagram of a non-volatile memory system using single row/column decoders and read/write circuits.

An example memory system which provides adaptive sensing is discussed next. FIG. 1 is a block diagram of a non-volatile memory system using single row/column decoders and read/write circuits. The diagram illustrates a memory device 196 having read/write circuits for reading and programming a page of storage elements in parallel, according to one embodiment. Memory device 196 may include one or more memory die 198. Memory die 198 includes a two-dimensional memory array of storage elements 155, control circuitry 110, and read/write circuits 165. The memory array 155 is discussed further in connection with FIG. 4.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 196 (e.g., a removable storage card) as the one or more memory die 198. Commands and data are transferred between the host and controller 150 via lines 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. The power control module 116 includes a power supply and monitoring circuit 122 which is discussed further in connection with FIG. 5.

In some implementations, some of the components of FIG. 1 can be combined. In various designs, one or more of the components (alone or in combination), other than memory array 155, can be thought of as a managing or control circuit. For example, one or more managing or control circuits may include any one of, or a combination of, control circuitry 110, state machine 112, decoders 114/160, power control 116, sense blocks 100 (including the processor 192 in FIG. 2), read/write circuits 165, and controller 150, etc. The sense block 100 is discussed further in connection with FIG. 2.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2:
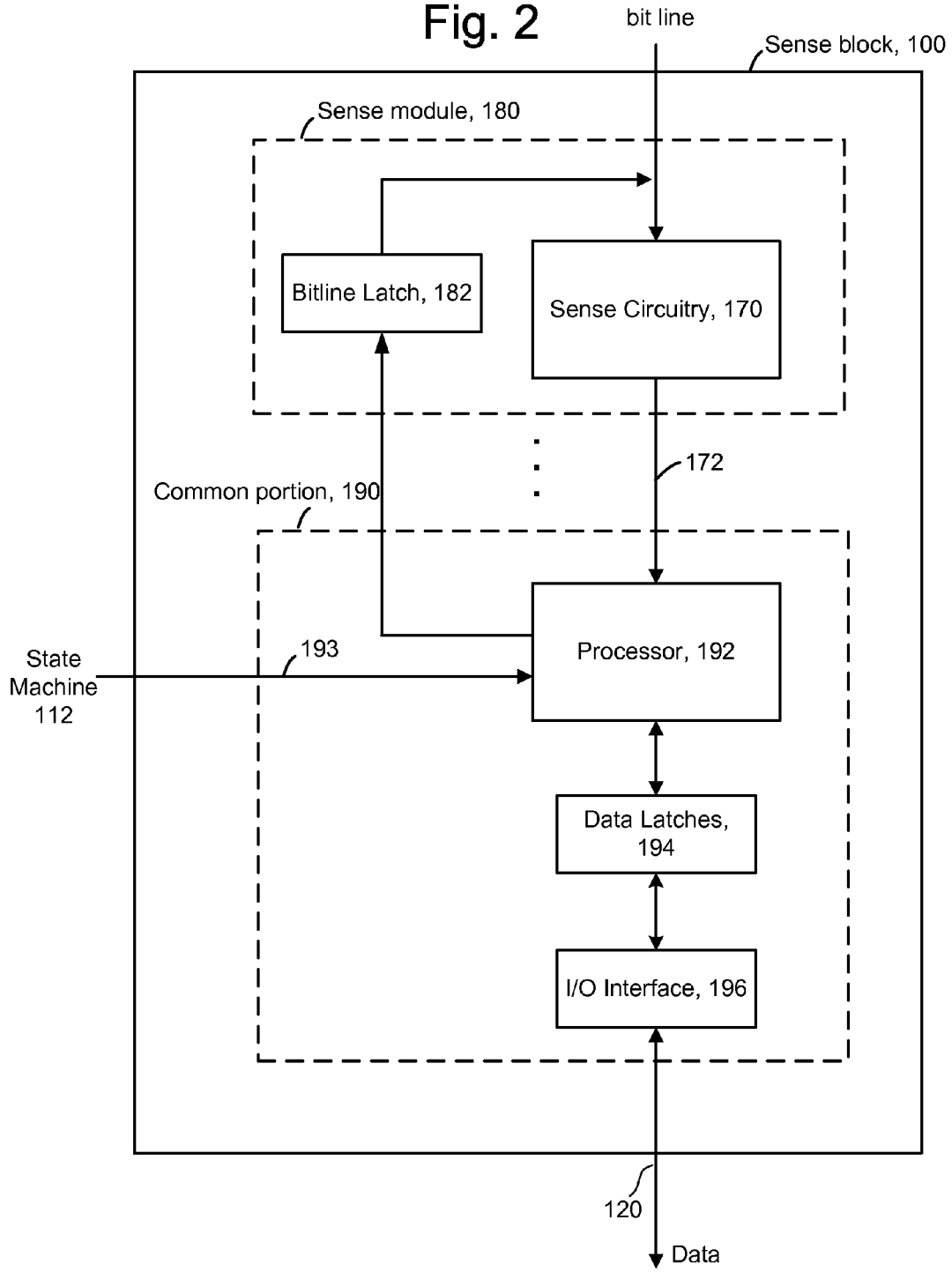
FIG. 2 is a block diagram depicting one embodiment of the sense block 100 of FIG. 1.

FIG. 2 is a block diagram depicting one embodiment of a sense block. An individual sense block 100 is partitioned into one or more core portions, referred to as sense modules 180 or sense amplifiers, and a common portion 190. In one embodiment, there will be a separate sense module 180 for each bit line and one common portion 190 for a set of multiple, e.g., eight, sense modules 180. Each of the sense modules in a group communicates with the associated common portion via data bus 172.

Sense module 180 comprises sense circuitry 170 that determines whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V).

Common portion 190 comprises a processor 192, a set of data latches 194 and an I/O Interface 196 coupled between the set of data latches 194 and data bus 120. Processor 192 performs computations. For example, one of its functions is to determine the data stored in the sensed storage element and store the determined data in the set of data latches. The set of data latches 194 is used to store data bits determined by processor 192 during a read operation. It is also used to store data bits imported from the data bus 120 during a program operation. The imported data bits represent write data meant to be programmed into the memory. I/O interface 196 provides an interface between data latches 194 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and an output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194. In another embodiment of the core portion, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed is stored in the set of data latches 194 from the data bus 120. The program operation, under the control of the state machine, comprises a series of programming voltage pulses applied to the control gates of the addressed storage elements. Each program pulse is followed by a read back (verify) to determine if the storage element has been programmed to the desired memory state. Processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Data latch stack 194 contains a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3:
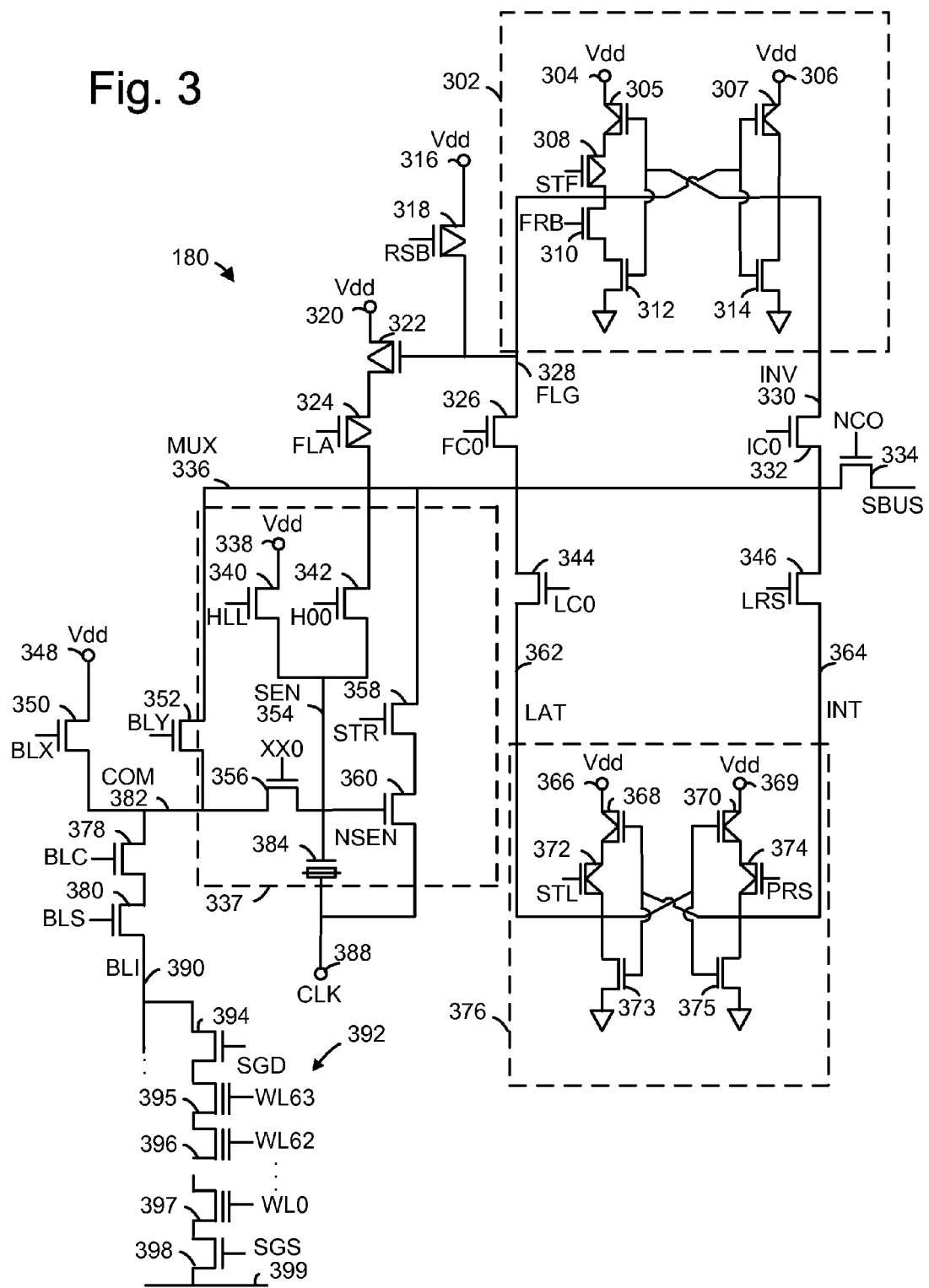
FIG. 3 depicts one example implementation of the sense module 180 of FIG. 2.

FIG. 3 depicts one example implementation of the sense module 180 of FIG. 2. Generally, each sense module includes a sense node 354 which communicates with a respective bit line 390, and each bit line is associated with a respective chain of series-connected storage elements, such as NAND string 392, in a memory array.

The transistors depicted can include n-type metal-oxide-semiconductor field-effect transistor (MOSFETs) and partially-insulated field-effect transistors (PiFETs), for instance. The sense module 180 includes, generally, a sense portion 337, a FLG latch 302 and a LAT latch 376. The FLG latch 302 sets a flag value, FLG, on path 328 to high or low. A value INV on path 330 is the inverse of FLG. Nodes 304 and 306 receive a power supply Vdd. Generally, Vdd can be provided by the power supply and monitoring circuit 122 of FIG. 1, which is common to all sense blocks, including sense modules, in a memory array. Vdd can be about 1.5-2.5 V, for instance. This power supply can be specific to the sense modules, and different than a power supply to the overall memory device. STF transistor 308 and FRB transistor 310 receive appropriate control signals to provide the desired FLG level. In this implementation, the STF transistor 308 is a PiFET, and the symbol used to identify it is as a PiFET is used elsewhere in FIG. 3 to identify other PiFETs. Also, the FRB transistor 310 is an nMOS, and the symbol used to identify it is as an nMOS is used elsewhere in FIG. 3 to identify other nMOSs.

A gate of a transistor 305 is connected to a transistor 312 of a ground path. Similarly, a gate of a transistor 307 is connected to a transistor 314 of a ground path.

With FLG high, a transistor 322 is non-conductive. Transistor 322, when conductive, couples a power supply terminal 320 to a FLA transistor 324.

An NCO transistor 334 connects a MUX path 336 to a sense bus (SBUS) for input and output of data. An ICO transistor 332 controls whether the INV path 330 communicates with the MUX path 336. An FCO transistor 326 controls whether the FLG path 328 communicates with the MUX path 336.

A reset or RSB transistor 318 controls whether a power supply node 316 communicates with the FLG path 328.

In the LAT latch 376, a value LAT is set on path 362 to high or low. INT on path 364 is the inverse of LAT. Nodes 366 and 369 receive Vdd. STL transistor 372 and PRS transistor 374 receive appropriate control signals to provide the desired LAT level. A gate of transistor 368 is connected to a transistor 373 of a ground path. Similarly, a gate of transistor 370 is connected to a transistor 375 of a ground path.

An LCO transistor 344 controls whether the LAT path 362 communicates with the MUX path 336. An LRS transistor 346 controls whether the INT path 364 communicates with the MUX path 336.

The sense portion 337, which is used during a verify or read operation, includes a sense path or node 354, a XX0 transistor 356 which controls whether the sense path communicates with the COM path 382, an HLL transistor 340 which controls whether the sense path communicates with a power supply node 338, and an H00 transistor 342 which controls whether the sense path communicates with the MUX path 336. The HLL and H00 transistors can be used for lock out or no lock out sensing, respectively. The SEN path 354 is coupled to a control gate of an NSEN transistor 360, and an STR transistor 358 controls whether the transistor 360 communicates with the MUX path 336. A clock CLK signal is provided at a node 388 to a dynamic capacitor 384.

A BLY transistor 352 controls whether the MUX path 336 communicates with the COM path 382, while a BLX transistor 350 controls whether the COM path 382 communicates with a power supply node 348. The BLC transistor 378 and BLS transistor 380 control whether the COM path 382 communicates with the bit line BL1 390. The bit line 390 may communicate with one or more NAND strings. An example NAND string 392 includes a drain select gate SGD 394, storage elements 395, 396, . . . , 397 whose control gates communicate with word lines WL63, WL62, . . . , WL0, respectively, for example, and a source select gate SGS 398 which communicates with a source line 399.

Generally, a read operation involves applying a control gate voltage such as Vra, Vrb or Vrc to a selected storage element in the NAND string 392. A verify operation involves applying a control gate voltage such as Vva, Vvb or Vvc to a selected storage element. The control gate voltage can be applied via a corresponding word line to multiple selected storage elements in corresponding multiple NAND strings at the same time. Each NAND string may have a respective sense module, in one possible approach. The control gate voltages of other, unselected storage elements in the NAND string 392 and other NAND strings are raised to a level (referred to as a read pass level) which is sufficient to render the unselected storage elements conductive. With the control gate voltage applied, the sense module 180 is controlled to interact with the selected storage element, via a respective bit line, to determine the state of the storage element. Typically, a conductive or non-conductive state of the selected storage can be determined.

In one possible implementation, the HLL transistor 340 receives a voltage Vhll at its control gate which sets an initial voltage level of the sense node 354 as Vhll-Vth, where Vth is a threshold voltage of the HLL transistor 340. Essentially, the HLL transistor allows a portion of the supply voltage Vdd at node 338 to reach the sense node. The HLL transistor 340 may therefore be considered to be a voltage-setting transistor. The voltage applied to the sense node is considered to provide a pre-charge of the sense node. At this time, the sense node is not allowed to communicate with the bit line 390 by providing the XX0 transistor 356 in a non-conductive state. Subsequently, Vhll is lowered so that the HLL transistor 340 becomes non-conductive, and the sense node is cutoff from the supply node 338. The BLX transistor 350 is made conductive to provide Vdd at node 348 to the BLC transistor 378, and a gate of the BLC transistor is controlled to pass a portion of Vdd to the bit line 390, thereby pre-charging the bit line. The XX0 transistor 356 is controlled to be in a conductive state, so that the sense node 354 communicates with the bit line 390. The SGS transistor 398 is also controlled to be in a conductive state so that the sense node can discharge into the bit line, the unselected storage elements, and the selected storage element, to the source line 399, if the selected storage element is in a conductive state. If the selected storage element is in a non-conductive state, the sense node will not appreciably discharge.

When the XX0 transistor 356 is conductive, a path from node 348 to the bit line 390, via the BLX transistor 350, is also conductive. Node 348 is at a higher voltage than the sense node, so the current from the sense node will go towards the bit line until the sense node drops below a certain level. Once the sense node is below the BLX voltage, there will not be any more current flowing through the XX0 transistor 356 to the bit line 390. Instead, all current coming to the bit line will be from the BLX transistor 350. Note that the CLK signal is at ground. Thus, in one possible approach, a discharge time period of the sense node begins when the XX0 transistor 356 is made conductive, and ends when the XX0 transistor is made non-conductive.

At a predetermined sensing time after discharging starts, the sense node is sensed to determine its voltage. Data is latched from the sense node based on the sense node level. In one possible approach, the NSEN transistor 360 performs this task. If the sense node voltage is above the threshold voltage of the NSEN transistor 360, the NSEN transistor 360 will be in a conductive state. This means the discharge of the sense node was not appreciable, and it can be concluded that the selected storage element is in a non-conductive state. On the other hand, if the sense node voltage is at or below the threshold voltage of the NSEN transistor 360, the NSEN transistor 360 will be in a non-conductive state. This means the discharge of the sense node was appreciable, and it can be concluded that the selected storage element is in a conductive state. The NSEN transistor 360 may therefore be considered to be a voltage-sensing transistor. A latch value is set to 0 or 1 and output via the bus to the processor 192 according to whether the NSEN transistor 360 is in a conductive or non-conductive state, respectively, indicating that the selected storage element is in a non-conductive or conductive state, respectively. For example, the FLG node 328 is reset to high, and the STR transistor 358 and the FC0 transistor 326 can be made conductive to attempt to flip the FLG latch 302. The FLG latch is flipped if NSEN 360 is conductive, or not flipped if NSEN is not conductive.

In an all bit line architecture, the bit lines are driven by the sense modules. During a sensing operation, including pre-charge or recovery, the bit lines are pulled up by Vdd of the sense modules through the BLC transistor, which has an analog gate bias to clamp the bit line voltage. As discussed further below in connection with FIGS. 9a-c, during sense node discharge, a surge of charge is dumped into the selected bit lines, which are involved in a sensing operation, causing a drop in Vdd and a current spike in the corresponding current, Idd. The drop in Vdd is due to a temporarily lower bit line voltage which occurs during discharge. Vdd is temporarily pulled down by NAND strings or other chains of series-connected storage elements which are conductive. Vdd is subsequently pulled back up by the power supply circuit.

Although the bit line voltage is nominally clamped at a fixed level by applying a fixed gate voltage to the BLC transistor 378, the drain of the BLC transistor (coupled to the COM path 382 and the BLX transistor 350) is pulled low when the source of the BLC transistor (coupled to the bit line 390), is pulled low. This in turn pulls Vdd low, such as via the BLX transistor 350 and the node 348. Moreover, the unselected bit lines, which are not involved in the sensing operation, can be pulled low due to capacitive coupling from the selected bit lines being pulled low. This can occur for unselected NAND chains which become conductive when a storage element connected to the selected word line voltage becomes conductive. The unselected storage elements in all NAND chains are conductive during a sensing operation due to application of relative high read pass voltages to the unselected word lines. With potentially thousands of sense modules connected to one power supply, and concurrent sensing operations being performed for many of the sense modules, the power supply can experience a noticeable perturbation which could result in inaccurate sensing if the sense data is obtained before the perturbation has been sufficiently attenuated.

Towards the end of the sense node discharge period, the bit line voltage level settles so that the perturbation of Vdd dies down, and Vdd recovers toward a steady state level, which is typically close to the level before the perturbation. The current spike also dies down so that Idd will eventually reach a steady state level when the bit lines reach a steady state level.

From these observations, the voltage or current level of the power supply provides an indication of when the sense node discharge has concluded, and when the sense data can be latched at the soonest possible time, without concern that the sense node discharge is still in progress.

In one approach, the stability of the power supply can be judged by monitoring the level of Vdd. When it is perturbed and subsequently recovers to within a certain percentage of the original level, it indicates the sense node discharge is almost done. In another approach, a determination is made as to when Vdd subsequently recovers to some steady state level which is not necessarily the same as the original, pre-perturbation level. Another approach is to monitor the slope, e.g., rate of change, of Vdd or Idd. When the bit lines all reach steady state, Vdd and Idd should also be in a steady state, which means the rate of change is zero or close to zero. In reality, an exact steady state need not be reached, as long as long as the rate of change is small enough the sense node discharge can be considered done. These techniques assume low resistance in routing the power supply to the sense modules.

With this approach, the state machine can decide the soonest possible time to move on to the next action in a sensing operation following sense node discharge, so that the duration of the sensing operation is minimized. A benefit is that it is self-adaptive in all situations, so that no fixed timing budget is needed. For the worst case memory chips, the performance will be similar to the fixed time budget approach, but for the majority of memory chips, the duration of the sensing operation can be reduced by about 15%-20%. An optimum time budget is adaptively set for different memory devices according to the observed behavior of each memory device, and for one memory device at different times according to the observed behavior of the memory device at each of the different times.

The circuit of FIG. 3 is one possible implementation of a sense circuit. Other implementations are possible.

Figure 4:
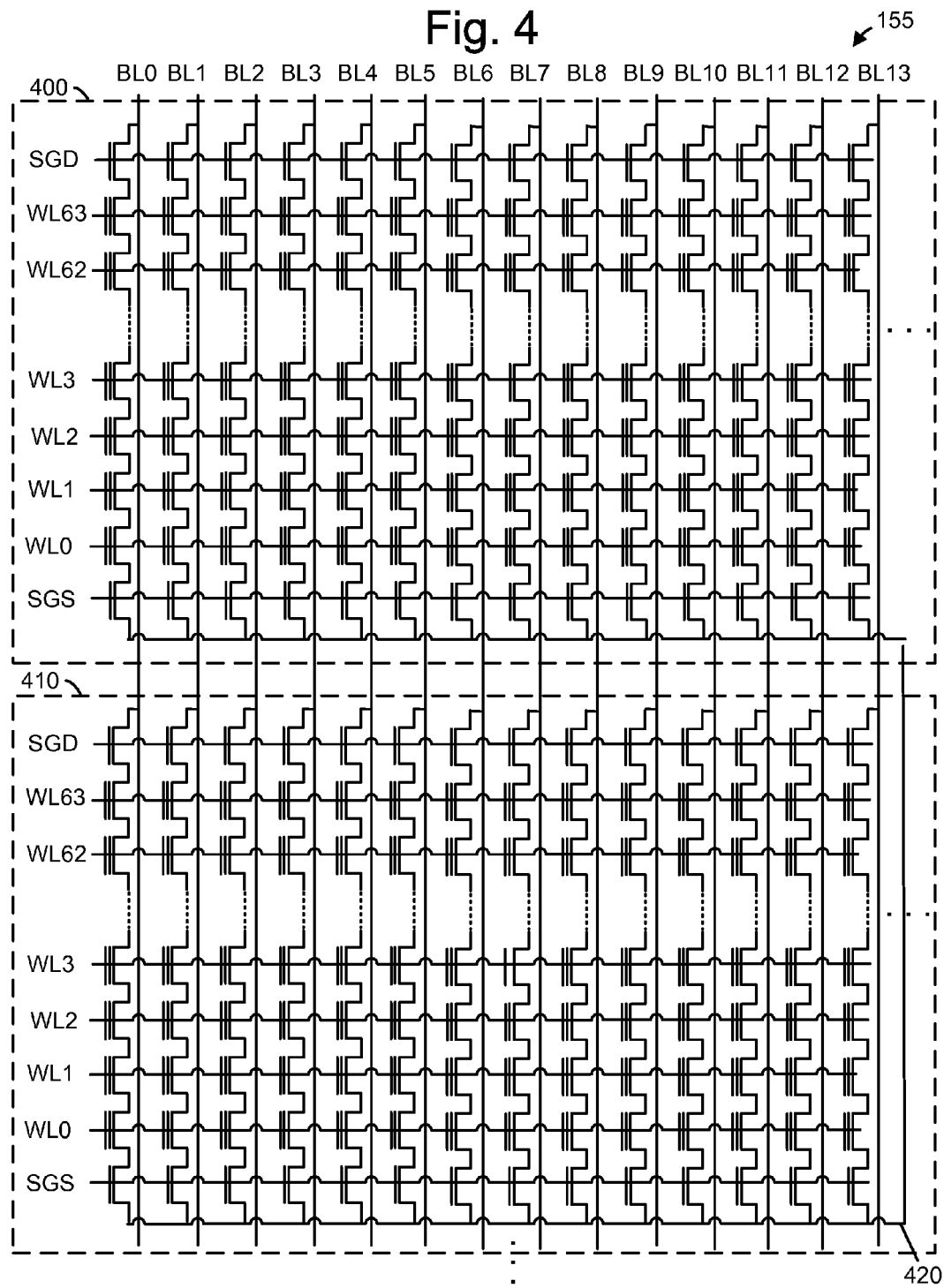
FIG. 4 depicts blocks of NAND flash memory cells in the memory array 155 of FIG. 1.

FIG. 4 depicts blocks of NAND flash memory cells in the memory array 155 of FIG. 1. The memory array can include many blocks. Each example block 400, 410 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 420. Sixty-four word lines, for example, WL0-WL63, extend between the source select gates and the drain select gates.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration Where a doped poly-silicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 5:
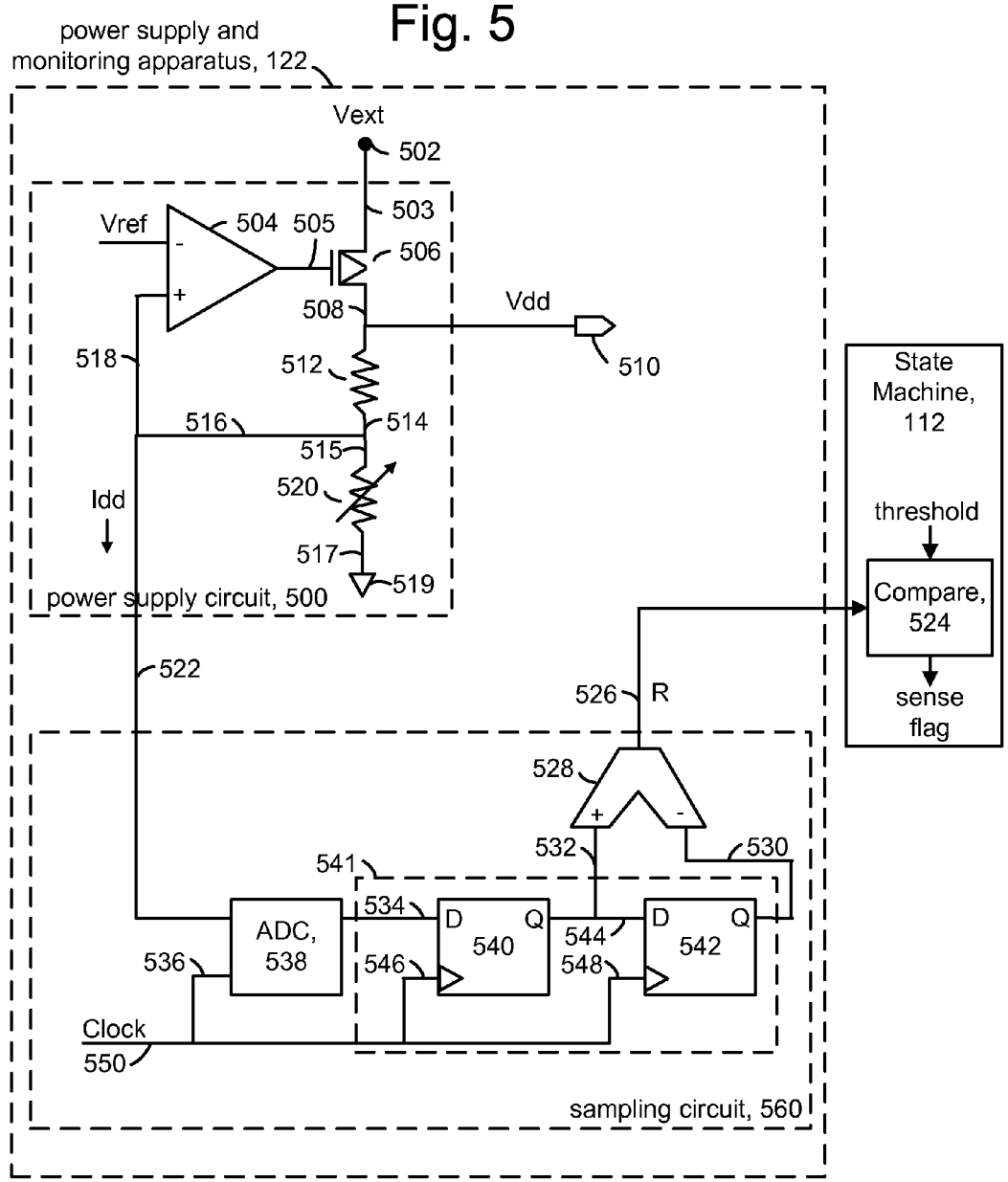
FIG. 5 depicts one example implementation of the power supply and monitoring apparatus 122 of FIG. 1.

FIG. 5 depicts one example implementation of the power supply and monitoring apparatus 122 of FIG. 1. The apparatus 122 includes a power supply circuit 500 which provides a voltage Vdd on a path 508 and node 510, which powers multiple sense modules. The power supply circuit includes an amplifier 504 which includes an inverting input terminal (−) and a non-inverting input terminal (+). A reference voltage, Vref, is provided to the inverting input terminal. The output of the amplifier at path 505 is provided to a gate of a transistor 506 which is in a source-follower arrangement so that the voltage at path 508 follows the gate voltage, due to a bias provided by an external voltage, Vext, at a node 502 and path 503. The path 508 is coupled to ground 519 via a resister 512, paths 514 and 515, a variable resistor 520 and path 517. A feedback path of the amplifier comprises path 508, resistor 512, and paths 514, 516 and 518.

The power supply circuit 500 is connected via a path 522 to a sampling circuit 560 which can sample the voltage or current on the path 522, which is connected to the feedback path of the power supply circuit 500. As described further below, e.g., in connection with FIGS. 8a-c and 9a-c, sampling can be used to determine when the voltage or current provided to the sense modules is stable, and this information can be used to adaptively set a time for latching data in the sense modules in a sense operation. The sampling circuit 560 can be configured to sample, temporarily store and perform calculations using, a specified number of sample points. In the example implementation provided, two sample points are used at a time to determine a rate of change of the voltage or current. However, it is possible to uses more than two sample points for each rate determination. Moreover, additional processing such as filtering to provide smoothing or averaging of multiple data points, and rejection of out of bounds data, can be used. Such filtering can be provided before and/or after the digital samples are obtained. Other processing can also be provided, such as amplification or attenuation of the power supply output before obtaining digital samples. Any signal which is derived from the power supply output and represents its perturbations can be used by the sampling circuit 560.

The sampling circuit includes an analog-to digital converter (ADC) 538 which provides a digital sample of the voltage or current on path 522 responsive to a clock signal on path 550 and 536. The digital sample comprises a number of bits. The clock signal indicates the rate at which samples are obtained, and can be set to provide a desired resolution. A 2-stage shift register 541 having flip-flops 540 and 542 is provided. The digital sample from the ADC 538 is provided via a path 534 to the data (D) input of the flip flop 540 and stored at an output Q. When the clock goes high on path 546 at a data advance input (represented by a triangle) of the flip flop 540, the digital sample at the output Q is provided via a path 544 to the data input of the flip flop 542, and to a path 532 which is connected to a positive input terminal of a subtractor 528. When the clock goes high on path 548 at a data advance input of the flip flop 542, the digital sample at the output Q is provided to a path 530 which is connected to a negative input terminal of the subtractor 528.

An output (R) of the subtractor 528 is a value which represents a difference between digital samples at times t(i) and t(i−1), e.g., ΔVdd or ΔIdd, where i is a sample or time index, and thus is data which represents a rate of change or slope of the digital samples. R can be provided to a compare block 524 in the state machine 112, discussed previously in connection with FIG. 1, in one possible approach. The compare block 524 obtains the magnitude of R, i.e., |R|, and compares it to a threshold to set a sense flag according to whether |R| is less than the threshold. R can be optionally be converted to units of a rate of change by dividing by the sampling interval, or, equivalently, multiplying by the sampling frequency. This can be done at the sampling circuit 560 or the state machine 112, for instance. |R| is less than the threshold when |R| is relatively low, indicating that the voltage or current of the power supply is sufficiently close to a steady state level, so that no significant perturbation is present. For example, sense flag=1 when |R|<threshold, and sense flag=0 when |R|≧threshold. Sense flag=1 can trigger the concurrent latching of sense data in the sense modules. An optimum threshold can be determined from testing or simulation.

Figure 6:
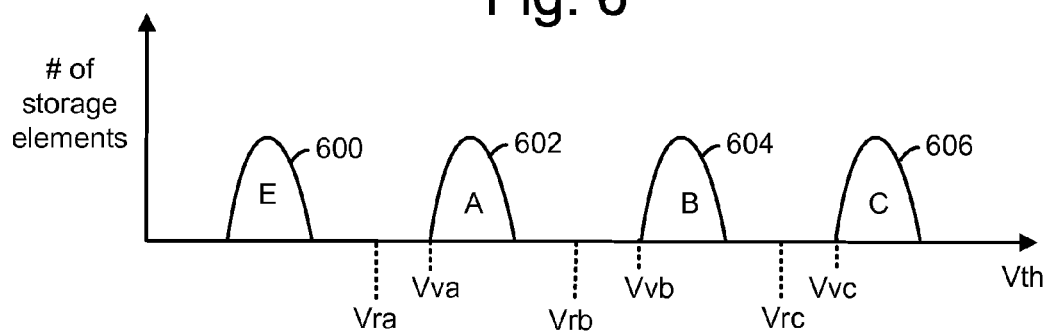
FIG. 6 depicts an example set of threshold voltage distributions.
Figure 7A:
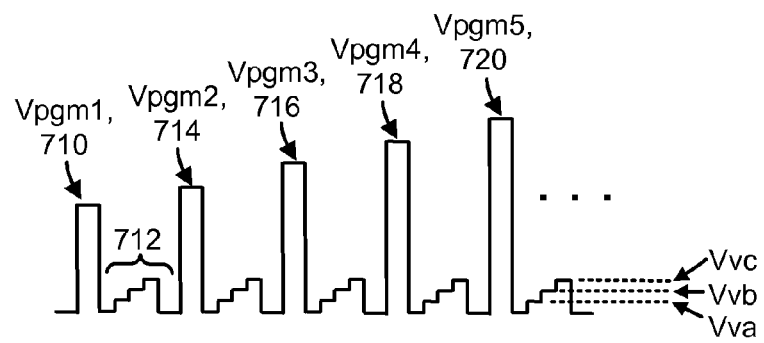
FIG. 7a depicts a voltage waveform applied to the control gates of storage elements during a program/verify operation.
Figure 7B:
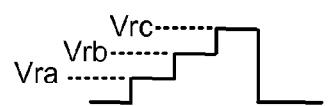
FIG. 7b depicts a voltage waveform applied to the control gates of storage elements during a read operation.

A brief overview of read and verify voltages is provided next in FIGS. 6, 7a and 7b before discussing further details of a sensing operation which uses the power supply and monitoring apparatus 122 in FIGS. 8a-c and 9a-c.

FIG. 6 depicts an example set of threshold voltage distributions for a storage element array for a case where each storage element stores N=2 bits of data, and there are $2^N=4$ data states. A first threshold voltage distribution 600 is provided for erased (E state) storage elements, while threshold voltage distributions 602, 604 and 606 represent programmed states A, B and C, respectively. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. Although four states are shown, the other multi-state structures including those that include more or less than four states can also be used.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, B or C, the system will test whether those storage elements have a threshold voltage greater than or equal to Vva, Vvb or Vvc, respectively. Various program schemes are known, includes single pass and multiple-pass schemes. As mentioned, four, eight, sixteen or even more data states can be provided. Generally, $2^N-1$ sense levels are used when there are $2^N$ states.

FIG. 7a depicts a voltage waveform applied to the control gates of storage elements during a program operation. The waveform or pulse train includes program pulses 710, 714, 716, 718 and 720 . . . , and a set of verify pulses between each program pulse, including example verify pulses 712, such as Vva, Vvb and Vvc. The program pulses can be fixed in amplitude, or they can step up by a fixed or varying step size, for instance. When each verify pulse is applied, a sense operation is performed for selected storage elements which are to be programmed to a particular target data state which is associated with the verify pulse, to evaluate the storage element's Vth relative to the verify voltage.

In one embodiment, the programming pulses have a voltage which starts at an initial level such as 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses. For example, verify pulses may be provided only for state A initially, then for states A and B, and then for states B and C. The waveform may be used during all bit line programming, for instance, in which storage elements of even- and odd-numbered bit lines are programmed together, and verified together. Or, the verify operation can be performed separately, e.g., first for the even-numbered bit lines and then for the odd-numbered bit lines.

FIG. 7b depicts a voltage waveform applied to the control gates of storage elements during a read operation. For example, voltages such as Vra, Vrb and Vrc can be applied. Sensing operations include both verify and read operations.

Figure 8A:
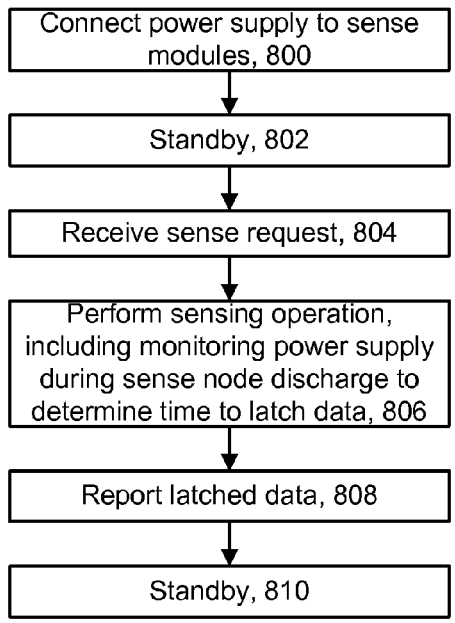
FIG. 8a depicts an overview of a process for sensing data using the power supply and monitoring apparatus of FIG. 5.

FIG. 8a depicts an overview of a process for sensing data using the power supply and monitoring apparatus of FIG. 5. The process includes connecting a power supply to a number of sense modules in parallel, e.g., concurrently, at step 800. At step 802, the sense modules are in a standby mode. Step 804 includes receiving a sense request at the sense module, such as from processor 192 (FIG. 2). In response, at step 806, a sensing operation is performed which includes monitoring the power supply during sense node discharge to determine a time to latch data at the sense node. Further details of step 806 are provided in FIG. 8c and FIGS. 9a-c. Step 806 includes reporting the latch data. For example, the data can be reported from the sense module to the processor 192, the state machine 112, the controller 150 or the host. Step 810 includes returning to the standby mode.

Figure 8B:
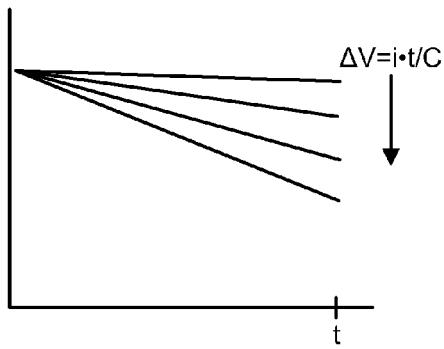
FIG. 8b depicts a sense node voltage discharge with time for different lines of fixed current, during a current sensing operation.

FIG. 8b depicts a sense node voltage discharge with time for different lines of fixed current, during a current sensing operation. In one possible approach, a sense module performs current sensing by determining a voltage drop at the sense node which is tied to a fixed current flow to the bit line by the relationship $\Delta V = i \cdot t/C$, where $\Delta V$ is the voltage drop at the sense node (and the bit line), i is the fixed current, t is a discharge time period, which is adaptively set as described, and C is the capacitance of the pre-charged capacitor 384 (FIG. 3). A greater voltage drop represents a higher current. For example, $\Delta V1 = i1 \cdot t/C$, $\Delta V2 = i2 \cdot t/C$, $\Delta V3 = i3 \cdot t/C$, and $\Delta V4 = i4 \cdot t/C$, where $\Delta V1 < \Delta V2 < \Delta V3 < \Delta V4$ and $i1 < i2 < i3 < i4$. At the end of the discharge period, since i and C are fixed, $\Delta V$ for a given current can be determined. In one approach, the NSEN transistor 360 is used to determine a level of $\Delta V$ relative to a demarcation value or trip point, which is the threshold voltage of the transistor 360.

Voltage sensing, in contrast, does not involve sensing a voltage drop which is tied to a fixed current. Instead, voltage sensing involves determining whether charge sharing occurs between a capacitor in a sensing circuit and a capacitance of the bit line. Current is not constant during the sensing. Little or no charge sharing occurs when the selected storage element is conductive, in which case the voltage of the capacitor in the voltage sensing module does not drop significantly. Charge sharing does occur when the selected storage element is non-conductive, in which case the voltage of the capacitor in the voltage sensing module does drop significantly.

The sensing module thus can determine whether the selected storage element is in a conductive or non-conductive state by the level of current. Generally, a higher current will flow (corresponding to a greater voltage discharge of the sense node) when the selected storage element is in a conductive state and a lower current, or essentially no current, will flow (corresponding to a lesser voltage discharge of the sense node) when the selected storage element is in a non-conductive state. It can be concluded that a threshold voltage of the selected storage element is above or below a compare level, such as a verify level or a read level, when it is in a non-conductive state or a conductive state, respectively.

Figure 8C:
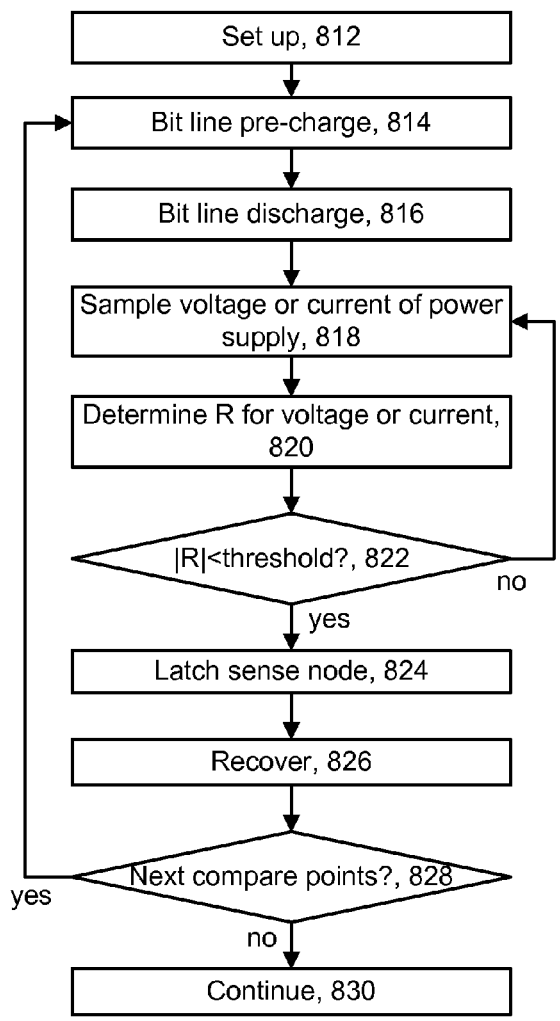

FIG. 8c depicts details of step 806 of FIG. 8a. At step 812, a setup phase is performed, at which time appropriate signals are set up in the sense modules for the sensing operation. At step 814, a bit line pre-charge phase is performed. At step 816, the bit line is provided with a path to discharge, e.g., via the SGS transistor to the source line, in the sense node discharge period. At step 818, the voltage or current of the power supply is sampled, such as by using the sampling circuit 560 of FIG. 5. At step 820, R, which represents the rate of change for the sampled voltage or current, is determined. At decision step 822, if |R|<threshold, the sense node is latched at step 824. Essentially, concurrent latch operations are initiated, such as by the state machine, for each of the sense modules for which sensing occurs. If decision step 822 is false, the voltage or current is sampled again at step 818, and the cycle repeats until decision step 822 is true, indicating that a sufficiently steady state condition has been reached. Latching the sense node can include updating the FLG latch 302 based on the sense node. For example, FLG=high if the sense node is low (discharged), and FLG=low if the sense node is high (not discharged). INV, the inverse of FLG, is reported to the processor 192.

At step 826, the signals in the sense module are allowed to recover. At decision step 828, if there is a next compare point, such as with a read operation, the process is repeated starting at step 814, using a different control gate read voltage on the selected word line. If there is no next compare point, the process is continued at step 830.

If the storage elements read store binary data, then steps 814-826 are performed once for the particular read or verify level. For multi-state storage elements, a read process can test for multiple read compare points, e.g., Vra, Vrb and Vrc. Therefore, steps 814-826 are performed for each read compare point.

FIG. 9a depicts time lines associated with step 806 of FIG. 8a. The time lines are not to scale and represent a simplified example. The time lines extend over time points t0-12. Waveform 900 represents the control gate voltage of the BLS transistor 380, Vbls, which can be the same as the control gate voltage of the SGD transistor 394, Vsgd. Generally, this voltage is sufficiently high to cause these transistors to act as pass gates. Waveform 902 represents the unselected word line voltage, Vwl_unsel, and waveform 904 represents the selected word line voltage, Vwl_sel. Waveforms 906 and 908 represent voltages of unselected bit lines. In particular, the voltage of an unselected bit line which is rendered conductive during a sensing operation is depicted. Waveform 906 includes a perturbation between t7 and t8, and waveform 908 includes a perturbation between t7 and t9. These are first and second examples, respectively, of possible discharge periods. For example, waveforms 906 and 908 may represent one memory device at different times, when a factor such as temperature causes different discharge periods. Or, waveforms 906 and 908 may represent respective memory devices which have inherently different discharge periods. The voltage of an unselected bit line which is non-conductive during a sensing operation would be similar except it would not have such a perturbation.

Waveform 910 represents the control gate voltage, Vblc, of the BLC transistor 378. Vblc is raised to clamp the selected bit lines to a constant level during sensing. Waveform 912 represents Vbl_sel, the selected bit line voltage. From t4-t7, before the discharge period which starts at t7, Vbl_sel=Vblc−Vth, where Vth is the threshold voltage of the BLC transistor. Waveform 916 represents Vbl_sel from t7-t11, for a bit line which does not appreciably discharge. Waveforms 920 and 914 represent Vbl_sel for a bit line which does appreciably discharge, for the first and second example discharge periods, respectively. Waveform 918 represents a discharge level for Vbl_sel. As can be seen, the discharge of the selected bit line as represented by waveforms 920 and 914 can couple to the unselected bit lines, pulling them down as well (waveforms 906 and 908, respectively).

Vdd, the power supply voltage, is at a nominal level such as Vref before the discharge period which begins at t7. Vdd experiences a perturbation in its amplitude from t7-t8 in the first example discharge period (waveform 922), or from t7-t9 in the second example discharge period (waveform 924).

R=ΔVdd/Δt, the rate of change of the power supply voltage, is at zero before the discharge period which begins at t7. The rate of change reflects the perturbation in Vdd from t7-t8 in the first example discharge period (waveform 926), or from t7-t9 in the second example discharge period (waveform 928). A rate threshold 929 is also depicted. As seen, during concurrent sensing operations, the power supply output experiences a perturbation, and the rate of change is indicative of an amplitude of the perturbation. When |R|<threshold, the sense data is latched. Note that, to provide a margin, before latching the sense data, it is also possible to wait a designated amount of time after concluding that |R|<threshold. The wait time can be fixed, regardless of the time period from the start of the discharge to the time at which |R|<threshold. In another possible approach, the wait time is a portion of the time period from the start of the discharge to the time at which |R|<threshold, such as 5-10% of that time period. An expanded view of waveforms 922 and 924 is provided in FIGS. 9b and 9c.

The power supply current, Idd, is an analog of the voltage Vdd. Idd is at a nominal level, Iref, before the discharge period which begins at t7, and experiences a perturbation in its amplitude from t7-t8 in the first example discharge period (waveform 930), or from t7-t9 in the second example discharge period (waveform 932). R=ΔIdd/Δt, the rate of change of the power supply current, is at zero before the discharge period which begins at t7. The rate of change reflects the perturbation in Idd from t7-t8 in the first example discharge period (waveform 934), or from t7-t9 in the second example discharge period (waveform 936). A rate threshold 935 is also depicted. In this case, the threshold is less than zero. Comparing |R| to a threshold avoids the need to consider the polarity of R.

Waveform 938 depicts the control gate voltage of the SGS transistor 398. The transistor is conductive at t7, at the start of the discharge period. Waveforms 940 and 942 represent a strobe signal which initiates the latching of data from the sense node, for the first and second example discharge periods, respectively. STR is toggled when |R|<threshold. Waveforms 946 and 944 represent the sense node voltage (SEN), for the first and second example discharge periods, respectively. A trip point level 948 is also depicted, which can be the Vth of the NSEN transistor 360. If the sense node voltage is above the trip point 948, then toggling STR will discharge the FLG latch 328 through the FCO transistor 326, FLG path 328, FCO 326, STR 358 and NSEN 360 to the CLK node 388 at ground. On the other hand, if the sense node voltage is below the trip point, there is no discharge current from the FLG path, so it stays high.

Generally, each sense node which is associated with a conductive chain of series-connected storage elements discharges past the trip point 948, and each sense node which is associated with a non-conductive chain of series-connected storage elements does not discharge past the trip point 948.

Waveforms 950 and 952 represent the control gate voltage of the XX0 transistor 356, for the first and second example discharge periods, respectively. XX0 is set high to start the discharge period by allowing the sense node to communicate with the bit line, and set low to end the discharge period, by preventing the sense node from communicating with the bit line. XX0 being set low can be triggered by |R|<threshold.

Waveform 954 represents the control gate voltage of the HLL transistor 340, which is set high to allow the sense node to be charged.

FIG. 9b depicts an expanded view of waveforms 922 and 924 of FIG. 9a. The time line between t7 and t9 is provided in further detail, and represents digital samples (by circles) of the waveforms such as can be obtained by the sampling circuit 560 of FIG. 5. For clarity, samples are depicted for waveform 922 only. A "sample n" represents an nth sample at t8, and a "sample n−1" represents next previous sample. The rate of change R at t8 can be calculated from these two samples, and the sampling period or rate. In this example, "sample n" is the first sample for which |R|<threshold, as seen in FIG. 9c.

FIG. 9c depicts an expanded view of waveforms 926 and 928 of FIG. 9a. Each circle represents a sample point which corresponds to, and is time-aligned with, a sample point in FIG. 9b. Sample point 931 is the first sample point for waveform 926 for which |R|<threshold, and corresponds to "sample n." When this sample point is reached, the sense node data can be latched. For the waveforms 924 and 928, a first sample point for which |R|<threshold can similarly be determined.

In one embodiment, a power supply and monitoring apparatus includes a power supply circuit connected to a plurality of sense circuits for a memory array, where the power supply circuit provides an output which powers the plurality of sense circuits. A sampling circuit samples the output of the power supply circuit during concurrent sensing operations of the plurality of sense circuits, and determines a value which represents a rate of change of the output. A compare circuit makes a comparison between the value and a threshold, where the comparison is used to initiate concurrent latch operations in each of the plurality of sense circuits when a magnitude of the value is less than the threshold.

In another embodiment, a power supply and monitoring apparatus includes an amplifier having an inverting input terminal, a non-inverting input terminal, and an output terminal, where a reference voltage is provided to the inverting input terminal. An output path follows a voltage of the output terminal, and is connected to sense circuits for a memory array, and to a feedback path to the non-inverting input terminal. An analog-to-digital converter is connected to the output path, and provides digital values based on the output path. A sampling is circuit connected to the analog-to-digital converter, and samples the digital values to determine a value which represents a rate of change of at least one of a voltage and a current of the output path. A compare circuit makes a comparison between the value and a threshold. The comparison is used to initiate concurrent latch operations in each of the plurality of sense circuits when a magnitude of the value is less than the threshold.

In another embodiment, a method for sensing in a storage system includes connecting a common power supply to sense circuits, where each sense circuit has a sense node, and is associated with a respective chain of series-connected storage elements in a memory array. The method further includes, for each respective sense circuit, initiating a discharge period in which the respective sense node is allowed to communicate with the respective chain of series-connected storage elements, so that each sense node associated with a conductive chain of series-connected storage elements discharges past a trip point, and each sense node associated with a non-conductive chain of series-connected storage elements does not discharge past the trip point. The method further includes monitoring a level of the common power supply during the discharge period, and in response to the monitoring, determining a time to obtain data from the sense nodes, where the data indicates whether the sense nodes have discharged past the trip point.

In another embodiment, a storage system includes means for connecting a common power supply to sense circuits, where each sense circuit has a sense node, and is associated with a respective chain of series-connected storage elements in a memory array. The storage system further includes, for each respective sense circuit, means for initiating a discharge period in which the respective sense node is allowed to communicate with the respective chain of series-connected storage elements, so that each sense node associated with a conductive chain of series-connected storage elements discharges past a trip point, and each sense node associated with a non-conductive chain of series-connected storage elements does not discharge past the trip point. The storage system further includes means for monitoring a level of the common power supply during the discharge period, and means for, in response to the monitoring, determining a time to obtain data from the sense nodes, where the data indicates whether the sense nodes have discharged past the trip point.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A power supply and monitoring apparatus, comprising:
   a power supply circuit connected to a plurality of sense modules for a memory array, the power supply circuit provides an output which powers the plurality of sense modules;
   a sampling circuit, the sampling circuit samples the output of the power supply circuit during concurrent sensing operations of the plurality of sense modules, and determines a value which represents a rate of change of the output; and
   a compare circuit, the compare circuit makes a comparison between the value and a threshold, the comparison is used to initiate concurrent latch operations in each of the plurality of sense modules when a magnitude of the value is less than the threshold.

2. The power supply and monitoring apparatus of claim 1, further comprising:
   a state machine which is responsive to the compare circuit, the state machine initiates the concurrent latch operations in each of the plurality of sense modules when the magnitude of the value is less than the threshold.

3. The power supply and monitoring apparatus of claim 1, wherein:
   the sampling circuit samples a voltage of the output to determine a value which represents a rate of change of the voltage; and
   the compare circuit determines whether a magnitude of the value which represents the rate of change of the voltage is less than the threshold.

4. The power supply and monitoring apparatus of claim 1, wherein:
   the sampling circuit samples a current of the output to determine a value which represents a rate of change of the current; and
   the compare circuit determines whether a magnitude of the value which represents the rate of change of the current is less than the threshold.

5. The power supply and monitoring apparatus of claim 1, wherein:
   the sampling circuit samples the output during a discharge period of the concurrent sensing operations.

6. The power supply and monitoring apparatus of claim 1, wherein:
   each sense module includes a sense node which communicates with a respective bit line, each bit line is associated with a respective chain of series-connected storage elements in the memory array, and the concurrent latch operations latch a value of the sense node in each sense module.

7. The power supply and monitoring apparatus of claim 1, wherein:
   during the concurrent sensing operations, the output experiences a perturbation, and the rate of change is indicative of an amplitude of the perturbation.

8. The power supply and monitoring apparatus of claim 1, wherein:
   each sense module communicates with a respective bit line, each bit line is associated with a respective chain of series-connected storage elements in the memory array, and the output is temporarily pulled down by chains of series-connected storage elements which are conductive, and subsequently pulled up by the power supply circuit.

9. The power supply and monitoring apparatus of claim 8, wherein:
   the value which represents the rate of change indicates when the output has been pulled up by the power supply circuit, and is sufficiently close to a steady state level.

10. The power supply and monitoring apparatus of claim 8, wherein:
    bit lines associated with the chains of series-connected storage elements which are conductive are pulled up by the power supply circuit through bit line clamp transistors whose gates have an analog gate bias.

11. A power supply and monitoring apparatus, comprising:
    an amplifier having an inverting input terminal, a non-inverting input terminal, and an output terminal, a reference voltage is provided to the inverting input terminal;
    an output path which follows a voltage of the output terminal, the output path is connected to a plurality of sense modules for a memory array, and to a feedback path to the non-inverting input terminal;
    analog-to-digital converter connected to the output path, the analog-to-digital converter provides digital values based on the output path;

a sampling circuit connected to the analog-to-digital converter, the sampling circuit samples the digital values to determine a value which represents a rate of change of at least one of a voltage and a current of the output path; and a compare circuit, the compare circuit makes a comparison between the value and a threshold, the comparison is used to initiate concurrent latch operations in each of the plurality of sense modules when a magnitude of the value is less than the threshold.

12. The power supply and monitoring apparatus of claim 11, further comprising:

a state machine which is responsive to the compare circuit, the state machine initiates the concurrent latch operations in each of the plurality of sense modules when the magnitude of the value is less than the threshold.

13. The power supply and monitoring apparatus of claim 11, wherein:

each sense module includes a sense node which communicates with a respective bit line, each bit line is associated with a respective chain of series-connected storage elements in the memory array, and the concurrent latch operations latch a value of the sense node in each sense module.

14. The power supply and monitoring apparatus of claim 11, wherein:

during the concurrent sensing operations, the output path experiences a perturbation, and the value is indicative of an amplitude of the perturbation.

15. The power supply and monitoring apparatus of claim 11, wherein:

each sense module communicates with a respective bit line, each bit line is associated with a respective chain of series-connected storage elements in the memory array, the output path is temporarily pulled down by chains of series-connected storage elements which are conductive, and subsequently pulled up by the power supply circuit, and the value indicates when the output path has been pulled up by the power supply circuit, and is sufficiently close to a steady state level.

16. A method for sensing in a storage system, comprising:

connecting a common power supply to a plurality of sense modules, each sense module has a sense node, and is associated with a respective chain of series-connected storage elements in a memory array;

for each respective sense module, initiating a discharge period in which the respective sense node is allowed to communicate with the respective chain of series-connected storage elements, so that each sense node associated with a conductive chain of series-connected storage elements discharges past a trip point, and each sense node associated with a non-conductive chain of series-connected storage elements does not discharge past the trip point;

monitoring a level of the common power supply during the discharge period; and in response to the monitoring, determining a time to obtain data from the sense nodes, the data indicates whether the sense nodes have discharged past the trip point.

17. The method of claim 16, wherein:

the level of the common power supply experiences a perturbation during the discharge period, and the monitoring indicates when the level of the common power supply has returned sufficiently close to a steady state level.

18. The method of claim 16, wherein:

the monitoring determines a value which represents a rate of change of the level of the common power supply during the discharge period.

19. The method of claim 16, wherein:

the level of the common power supply is temporarily pulled down by the chains of series-connected storage elements which are conductive during the discharge period, and subsequently pulled up by the common power supply.

20. The method of claim 16, wherein:

the time to obtain data from the sense nodes indicates an end of the discharge period.

\* \* \* \* \*